(12) United States Patent
Jentzsch et al.

(10) Patent No.: US 11,942,756 B2
(45) Date of Patent: Mar. 26, 2024

(54) RADIATION-EMITTING SEMICONDUCTOR CHIP WITH REFLECTIVE INNER SURFACE AND ANTI-REFLECTIVE COATING AND METHOD FOR PRODUCING THEREOF

(71) Applicant: OSRAM Opto Semiconductors GmbH, Regensburg (DE)

(72) Inventors: Bruno Jentzsch, Regensburg (DE); Alexander Tonkikh, Cork (IE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 428 days.

(21) Appl. No.: 17/421,195

(22) PCT Filed: Jan. 8, 2020

(86) PCT No.: PCT/EP2020/050301
§ 371 (c)(1),
(2) Date: Jul. 7, 2021

(87) PCT Pub. No.: WO2020/144226
PCT Pub. Date: Jul. 16, 2020

(65) Prior Publication Data
US 2022/0059985 A1     Feb. 24, 2022

(30) Foreign Application Priority Data

Jan. 10, 2019   (DE) ................... 102019100532.9

(51) Int. Cl.
| | | |
|---|---|---|
| *H01S 5/02255* | (2021.01) | |
| *H01L 33/00* | (2010.01) | |
| *H01L 33/44* | (2010.01) | |
| *H01L 33/46* | (2010.01) | |

(Continued)

(52) U.S. Cl.
CPC ...... *H01S 5/02255* (2021.01); *H01L 33/0045* (2013.01); *H01L 33/0093* (2020.05);
(Continued)

(58) Field of Classification Search
CPC .. H01S 5/02255; H01S 5/0287; H01S 5/4012; H01S 5/4056; H01L 33/0093;
(Continued)

(56) References Cited

U.S. PATENT DOCUMENTS

| | | | |
|---|---|---|---|
| 3,900,863 A | * | 8/1975 | Kim ................. H01L 33/00 148/DIG. 115 |
| 5,498,883 A | | 3/1996 | Lebby et al. |

(Continued)

FOREIGN PATENT DOCUMENTS

| | | |
|---|---|---|
| DE | 102018105080 | 9/2019 |
| EP | 1063743 A1 | 12/2000 |
| EP | 1553640 A1 | 7/2005 |

OTHER PUBLICATIONS

International Search Report (with English Translation) and Written Opinion in corresponding International Application No. PCT/EP2020/050301 dated Apr. 29, 2020, 12 pages.

(Continued)

*Primary Examiner* — Lex H Malsawma
(74) *Attorney, Agent, or Firm* — MH2 TECHNOLOGY LAW GROUP LLP (57) ABSTRACT

The invention relates to a radiation-emitting semiconductor chip comprising a semiconductor layer sequence having at least two active regions which generate electromagnetic radiation during operation and at least one reflective outer surface which is arranged to the side of each active region wherein the reflective outer surface includes an angle of at least 35° and at most 55° with a main extension plane of the semiconductor chip. The invention also relates to a method for producing a radiation-emitting semiconductor chip.

16 Claims, 9 Drawing Sheets

(51) Int. Cl.
*H01S 5/028* (2006.01)
*H01S 5/40* (2006.01)

(52) U.S. Cl.
CPC .............. *H01L 33/44* (2013.01); *H01L 33/46* (2013.01); *H01S 5/0287* (2013.01); *H01S 5/4012* (2013.01); *H01S 5/4056* (2013.01); *H01L 2933/0025* (2013.01)

(58) Field of Classification Search
CPC ..... H01L 33/0045; H01L 33/44; H01L 33/46; H01L 2933/0025
See application file for complete search history.

(56) References Cited

U.S. PATENT DOCUMENTS

| | | |
|---|---|---|
| 5,606,181 A | 2/1997 | Sakuma et al. |
| 7,453,099 B2 | 11/2008 | Kato et al. |
| 8,035,118 B2 * | 10/2011 | Kususe .................. H01L 33/08 257/90 |
| 2006/0231852 A1 * | 10/2006 | Kususe .................. H01L 33/62 257/79 |
| 2010/0193769 A1 | 8/2010 | Occhi et al. |
| 2014/0092391 A1 | 4/2014 | Matsuu et al. |

OTHER PUBLICATIONS

Carter et al., "A New Surface Emitting GaInAsP 1.3um LED With up To Threefold Enhancement in External Quantum Efficiency", International Electron Devices Meeting IEEE, 1979, pp. 118-121.

\* cited by examiner

RADIATION-EMITTING SEMICONDUCTOR CHIP WITH REFLECTIVE INNER SURFACE AND ANTI-REFLECTIVE COATING AND METHOD FOR PRODUCING THEREOF

CROSS-REFERENCE TO RELATED APPLICATIONS

This patent application is a national stage entry from International Application No. PCT/EP2020/050301, filed on Jan. 8, 2020, published as International Publication No. WO 2020/144226 A1 on Jul. 16, 2020, and claims priority under 35 U.S.C. § 119 from German patent application 10 2019 100 532.9, filed Jan. 10, 2019, the entire contents of all of which are incorporated by reference herein.

FIELD

A radiation-emitting semiconductor chip is provided. Furthermore, a method for producing a radiation-emitting semiconductor chip is provided.

BACKGROUND

An object to be solved is to provide a radiation-emitting semiconductor chip having an improved radiation characteristic. Furthermore, a method for producing such a radiation-emitting semiconductor chip is to be provided.

These objects are solved by a radiation-emitting semiconductor chip having the features of claim 1 and by a method having the steps of claim 17.

Advantageous embodiments of the radiation-emitting semiconductor chip and of the method for producing a radiation-emitting semiconductor chip are the subject of the respective dependent claims.

SUMMARY

According to one embodiment, the radiation-emitting semiconductor chip comprises a semiconductor layer sequence with at least two active regions which generate electromagnetic radiation during operation. Should there be a simplified reference to "radiation" here and in the following, "electromagnetic radiation" is meant.

The semiconductor layer sequence is preferably based on a III-V compound semiconductor material, such as a nitride compound semiconductor material, a phosphide compound semiconductor material or an arsenide compound semiconductor material.

The semiconductor chip preferably has a main extension plane. A lateral direction is preferably aligned parallel to the main extension plane and a vertical direction is aligned perpendicular to the lateral direction.

The radiation generated during operation of the at least two active regions can be near-ultraviolet radiation, visible light and/or near-infrared radiation.

Preferably, the at least two active regions are spaced apart from one another in the lateral direction. That is to say that in this case, the at least two active regions are not in direct contact with one another at any point on the semiconductor chip. Furthermore, the at least two active regions are preferably arranged in a common plane. That is to say that the at least two active regions are preferably formed without overlap in plan view.

Alternatively, it is possible that the at least two active regions are adjacent to one another, for example in the middle. In this case, it is possible that the at least two active regions are in direct contact with one another.

According to one embodiment, the radiation-emitting semiconductor chip comprises a carrier. The carrier is preferably provided and arranged to mechanically stabilise the semiconductor chip. The carrier can be formed of a potting. For example, the potting is a metal. In this case, the carrier is electrically conductive. Advantageously, the heat dissipation of the semiconductor chip can be improved by means of the metallic potting.

Furthermore, it is also possible that the carrier comprises a semiconductor material or consists of a semiconductor material. For example, the semiconductor material is silicon. In this case, the carrier is electrically insulating.

If the carrier is electrically insulating, the active regions can be energised by means of an electrically conductive contact. In this case, the electrically conductive contact is embedded in the potting.

According to one embodiment, the radiation-emitting semiconductor chip comprises an electrically insulating region arranged between the active regions. The electrically insulating region preferably provides the lateral spacing of the active regions. Preferably, the electrically insulating region comprises or consists of an electrically insulating material. For example, the electrically insulating region comprises or is formed from one of the following materials: $SiO_2$, $TiO_2$, $HfO_2$, $ZrO_2$.

Preferably, the electrically insulating region comprises $SiO_2$ with a refractive index of about 1.4. Therefore, a refractive index difference from the semiconductor layer sequence, for example based on AlGaAs with a refractive index of about 3.5, can be formed comparatively large. Advantageously, a total internal reflection of the radiation at the insulating region is thus increased.

According to one embodiment, the radiation-emitting semiconductor chip comprises at least one reflective outer surface arranged laterally of each active region. The at least one reflective outer surface preferably has a reflectivity of at least 90%, in particular 95%, 99% or 100%, for radiation generated in the active regions.

Preferably, each active region is arranged between the reflective outer surface and the electrically insulating region. For example, the active regions can be arranged laterally spaced from the reflective outer surface and the electrically insulating region.

The at least one reflective outer surface is configured to reflect a portion of the radiation from the active regions. The at least one reflective outer surface comprises, for example, a metal or consists thereof. For example, the at least one reflective outer surface comprises or consists of at least one of the following metals: silver, aluminium, rhodium, nickel, copper, gold.

An interface between the reflective outer surface and the semiconductor layer sequence is preferably electrically insulating. In this case, the reflective outer surface has a dielectric at the interface. In this case, the interface of the at least one reflective outer surface is electrically insulating.

Alternatively, it is possible that the at least one reflective outer surface is a Bragg mirror comprising alternately arranged layers of a high refractive index material and a low refractive index material. In this case, the at least one reflective outer surface is typically electrically insulating.

According to at least one embodiment, the reflective outer surface includes an angle of at least 35° and at most 55° with a main extension plane of the semiconductor chip. Preferably, the reflective outer surface includes an angle of at least 40° and at most 50° with a main extension plane of the semiconductor chip. Particularly preferably, the angle between the reflective outer surface facing the associated active region and the main extension plane of the semiconductor chip is 45°.

According to one embodiment, the radiation-emitting semiconductor chip comprises a semiconductor layer sequence having at least two active regions which generate electromagnetic radiation in operation and at least one reflective outer surface arranged laterally of each active region, the reflective outer surface includes an angle of at least 35° and at most 55° with a main extension plane of the semiconductor chip.

Furthermore, the active regions are preferably arranged in the same semiconductor layer sequence. Advantageously, the semiconductor chip is thus comparatively compact, in contrast to a semiconductor chip having two separate semiconductor layer sequences with one active region each.

According to one embodiment, the reflective outer surface is formed continuously and completely encloses the electrically insulating region. The reflective outer surface preferably has the shape of a circle or a polygon in plan view. In a cross-section perpendicular to the main extension plane, the reflective outer surface can comprise a first region and a second region facing one another. Preferably, each region of the reflective outer surface has an active region associated therewith. If the reflective inner surface has the shape of a circle in plan view, the reflective outer surface, each of which is associated with an active region, preferably each extends in a curved manner in the lateral direction.

If the reflective inner surface has the shape of a polygon in plan view, the reflective outer surface, each of which is assigned to an active region, extends in a straight line in the lateral direction. Alternatively, the reflective outer surface assigned to each active region can be formed non-continuously. In this case, each reflective outer surface assigned to an active region is preferably laterally spaced apart.

Alternatively, the reflective outer surface, which is associated with each active region, is composed of regions that extend linearly and curved in the lateral direction.

According to one embodiment, the electrically insulating region has a reflective inner surface arranged opposite the reflective outer surface. In this case, the reflective inner surface preferably has a reflectivity of at least 90%, in particular 95%, 99% or 100%, for radiation generated in the active regions.

The reflective inner surface is for example electrically insulating and for example comprises or consists of dielectric materials. For example, the reflective inner surface is a Bragg mirror comprising alternating layers of a high refractive index material and a low refractive index material. Furthermore, the reflective inner surface can be a combination of metallic materials and electrically insulating materials.

According to at least one embodiment, the reflective inner surface includes an angle of at least 35° and at most 55° with a main extension plane of the semiconductor chip. Preferably, the reflective inner surface includes an angle of at least 40° and at most 50° with a main extension plane of the semiconductor chip. Particularly preferably, the angle between the reflective inner surface facing the associated active region and the main extension plane of the semiconductor chip is 45°. Further, the reflective inner surface and the respective opposite reflective outer surface include an angle of 90°.

According to at least one embodiment, the reflective inner surface has the shape of a circle, a round ring, a polygon or a polygonal ring in plan view. Thus, the reflective inner surface is formed continuously. In a cross-section perpendicular to the main extension plane, the reflective inner surface can comprise a first region and a second region facing one another. Preferably, each region of the reflective inner surface has an active region associated therewith.

If the reflective inner surface has the shape of a polygon or a polygonal ring in plan view, the reflective inner surface, each of which is associated with an active region, each extends in a straight line in the lateral direction.

According to one embodiment, the electrically insulating region is formed as a protrusion which is laterally delimited by the reflecting inner surface. The protrusion preferably extends in vertical direction. A side surface of the protrusion can be formed by the reflective inner surface or comprise the reflective inner surface. An extension of the reflective inner surface in vertical direction preferably predetermines a height of the protrusion. Further, the protrusion can have a top surface. In this case, the top surface of the protrusion connects end points of the side surface of the protrusion. In this case, the top surface preferably extends in lateral direction.

According to one embodiment, the semiconductor layer sequence comprises a first cladding layer and a second cladding layer each extending in lateral direction. Furthermore, the first cladding layer and the second cladding layer are arranged one above the other in the vertical direction. The at least two active regions are preferably arranged between the first cladding layer and the second cladding layer.

According to one embodiment, the semiconductor layer sequence has an active zone comprising the active regions. The active zone is preferably arranged between the first cladding layer and the second cladding layer. For example, the active zone is immediately adjacent to the first cladding layer and the second cladding layer.

According to one embodiment, the reflective inner surface completely penetrates the active zone. The radiation generated in each of the active regions forms a beam having a beam profile which, in cross-section perpendicular to a main direction of extension of the beam, has a lateral extension and a vertical extension. If the reflective inner surface completely penetrates the active zone, the beam profile can completely overlap with the reflective inner surface in a lateral view and be reflected.

According to one embodiment, the active zone comprises a propagation region. Preferably, the radiation has a propagation direction along the active zone, which is predetermined by a longitudinal component of the propagation region. In cross-section to the propagation direction, the beam profile has a vertical and lateral extent predetermined by a vertical and lateral extent of the propagation region.

According to one embodiment, the active zone is arranged within the propagation region. Preferably, the propagation region projects beyond the active zone in vertical direction. The beam profile can thus project beyond the active zone in vertical direction. Furthermore, the propagation region can have the same dimension in lateral direction as the active zone.

The propagation region is preferably arranged between the first cladding layer and the second cladding layer. For example, the propagation region can comprise materials that are different from the first cladding layer and the second cladding layer. In this case, the cladding layers have a lower refractive index for radiation than the propagation region. By choosing the refractive index of the propagation region, for example, the vertical extent of the propagation region and thus of the beam profile can be predetermined.

According to one embodiment, the reflective inner surface only partially penetrates the propagation region. That is to say that the propagation region is not completely penetrated by the reflective inner surface. In this case, the beam profile can partially overlap with the reflective inner surface in a side view, wherein radiation of the non-overlapping part of the beam profile can propagate further in the propagation region.

For example, at most 70% of the reflective inner surface penetrates the propagation region. In this case, at most 70% of the radiation can be reflected by the reflective inner surface. Alternatively, it is possible that the reflective inner surface penetrates the propagation region by at most 50% and radiation can be reflected by the reflective inner surface by at most 50%. Furthermore, it is possible that the reflective inner surface penetrates the propagation region by at most 30% and that radiation can be reflected by the reflective inner surface by at most 30%.

If the at least two active regions are directly adjacent to one another, it is possible that the propagation region is not penetrated.

According to one embodiment, the reflecting outer surface completely penetrates the active zone. In this case, the beam profile can completely overlap with the reflective outer surface in a side view and be reflected.

According to one embodiment, the reflecting inner surface and the reflecting outer surface do not completely penetrate the semiconductor layer sequence. Preferably, the first cladding layer of the semiconductor layer sequence is not completely penetrated by the reflective inner surface and the reflective outer surface. That is to say that the first cladding layer is formed continuously. Further, the first cladding layer does not have openings penetrating the first cladding layer.

According to one embodiment, a first contact layer is arranged on a top surface of the semiconductor layer sequence. The first contact layer is preferably electrically conductive and is arranged and provided for electrically contacting the semiconductor layer sequence. Preferably, the first contact layer covers the top surface of the semiconductor layer sequence to a large extent. The first contact layer preferably covers 80% or 90% of the semiconductor layer sequence. The first contact layer preferably comprises or consists of a metal.

According to one embodiment, a second contact layer is arranged on a bottom surface of the semiconductor layer sequence. The second contact layer is preferably electrically conductive and is arranged and provided for electrically contacting the semiconductor layer sequence. The bottom surface of the semiconductor layer sequence is opposite the top surface. The second contact layer is preferably arranged in regions on the bottom surface of the semiconductor layer sequence. The second contact layer preferably comprises or consists of a metal.

The second contact layer has, for example, at least two contact regions which are each arranged spaced apart from one another in lateral direction on the bottom surface of the semiconductor layer sequence. Furthermore, the at least two contact regions each have a width and a length. The width of the at least two contact regions is preferably the same at each location. Alternatively, the width of the at least two contact regions can taper or widen in the direction of the electrically insulating region.

According to one embodiment, the first contact layer and the second contact layer predetermine the lateral dimensions of each active region.

If the second contact layer comprises the at least two contact regions, the at least two contact regions preferably each overlap with one of the at least two active regions in plan view. In the overlapping regions, a current density of the current to be impressed is comparatively high. In the overlapping regions, the current density is preferably so high that the active zone emits radiation and thus forms the at least two active regions. That is to say that the lateral dimensions of the at least two active regions are preferably predetermined by the width and the length of the at least two contact regions, respectively. Preferably, an active region has a larger area than an associated contact region.

Alternatively, the semiconductor chip comprises a ridge waveguide comprising the first cladding layer, the second cladding layer and/or the active zone. The ridge waveguide is formed by a protrusion comprising the first cladding layer, the second cladding layer and/or the active region. The lateral dimension of the ridge waveguide predetermines the lateral dimension of the active zone. Flanks of the ridge waveguide can each be covered by a passivation layer having a refractive index different from a refractive index of the first cladding layer and/or the second cladding layer, respectively. Advantageously, this allows the lateral dimensions of the active region to be particularly well predetermined.

According to one embodiment, the semiconductor layer sequence has a plurality of active regions which are arranged in pairs opposite one another and in a circular shape. In this case, the second contact layer preferably has a plurality of contact regions which are preferably arranged in pairs opposite one another and in a circular shape.

The contact regions preferably each provide a length and width of the active regions. The pairwise opposite active regions preferably have a common axis extending along the lengths of pairwise opposite active regions. An angle is preferably arranged between directly adjacent axes of two pairwise opposite active regions. In this case, the axes intersect in the electrically insulating region. Preferably, the angles between the axes are equidistant. Furthermore, directly adjacent axes of two pairwise opposite active regions can each have an angle of $180°/n$. In this case, n is the total number of axes and n*2 is the total number of active regions. If the semiconductor chip has directly adjacent axes, the propagation region runs along one of the axes at a time. Directly adjacent propagation regions preferably have an angle of $180°/n$, where n is the total number of propagation regions. Such an arrangement advantageously achieves a particularly homogeneous radiation characteristic.

According to one embodiment, the semiconductor layer sequence has a plurality of active regions which are arranged in pairs opposite one another and/or in a circular shape. For example, directly adjacent axes of two pairwise opposite of active regions extend parallel to one another.

According to one embodiment, a reflective coating is arranged on the semiconductor layer sequence in the region of the reflective outer surface. Preferably, the reflective coating is arranged on the top surface of the semiconductor layer sequence and can be in direct contact therewith. The reflective coating preferably has a reflectivity of at least 90%, 95% or 99% for the radiation. Thus, the reflective coating can be a highly reflective coating.

According to one embodiment, an anti-reflective coating is arranged on the semiconductor layer sequence in the electrically insulating region. The anti-reflective coating is preferably arranged on the top surface of the semiconductor layer sequence and can be in direct contact therewith. A reflection at the interface from the top surface of the semiconductor layer sequence to the anti-reflective coating is, for example, at most 20%, 10%, 5%, 0.0001% or 0.00001%.

One idea of the semiconductor chip described herein is, among other things, that the semiconductor layer sequence has at least two active regions, each of which generates electromagnetic radiation during operation. Radiation emitted in the active regions can propagate in the propagation region towards the reflective outer surface. The radiation can be reflected at the reflective outer surface towards the top surface of the semiconductor layer sequence. There, large parts of the radiation can be reflected by the reflective coating back to the reflective outer surface. The radiation initially emitted in the direction of the reflective outer surface is thus reflected back in the direction of the insulating region. The reflected radiation as well as the radiation emitted in the direction of the insulating region can subsequently be reflected at the reflecting inner surface in the direction of the top surface of the semiconductor layer sequence and be at least partially coupled out of the semiconductor chip via the anti-reflective coating.

Advantageously, a light coupling out efficiency and the radiation characteristic of the semiconductor chip is thus improved, since the emitted radiation of the active regions is coupled out via the anti-reflective coating and can be superimposed in the far field.

According to one embodiment, an anti-reflective coating is arranged on the semiconductor layer sequence in the region of the reflective outer surface and a reflective coating is arranged on the semiconductor layer sequence in the electrically insulating region. In this case, the emitted radiation of the active regions is coupled out via the anti-reflective coating above the reflective outer surface. Advantageously, the radiation is not locally superimposed in the region of the anti-reflective coating and a lower heating of the semiconductor chip can be achieved.

According to one embodiment, an anti-reflective coating is arranged on the semiconductor layer sequence in the region of the reflective outer surface and in the electrically insulating region. In this case, the emitted radiation of the active regions is coupled out via the anti-reflective coating above the reflective outer surface and over the reflective inner surface. Thus, a thermal load on the semiconductor chip can be further reduced.

In the case that the at least two active regions are adjacent to one another and the semiconductor chip thus has no electrically insulating region, the anti-reflective coating is arranged only on the semiconductor layer sequence in the region of the reflective outer surface. Alternatively, the anti-reflective coating can be arranged on the semiconductor layer sequence in the region of the reflective outer surface, which is assigned to one of the active regions. In this case, the reflective coating can be arranged on the semiconductor layer sequence in the region of the reflective outer surface which is assigned to an opposite active region.

According to one embodiment, the radiation-emitting semiconductor chip is a superluminescent light-emitting diode with an increased brightness and/or an increased luminous flux compared to a conventional light-emitting diode. The generated radiation of the superluminescent light-emitting diode can be amplified in the propagation region. For example, radiation that propagates towards the reflective outer surface can be directed towards the reflective inner surface by means of the reflective coating and further reflection at the reflective outer surface. Emitted radiation propagating in the direction of the inner surface can advantageously overlap with the reflected radiation coming from the reflecting outer surface. Advantageously, the radiation of the active regions superimposed in this way can be superimposed in the region of the anti-reflective coating. The coupled out radiation is thus amplified and exhibits increased brightness and/or luminous flux.

In contrast to a laser diode, superluminescent light-emitting diodes do not have a resonator. In connection with the superluminescent light-emitting diode, radiation is advantageously amplified, with the radiation having comparatively low temporal coherence and comparatively high spatial coherence.

According to one embodiment, the radiation-emitting semiconductor chip generates laser radiation. In this case, the semiconductor chip is, for example, a laser diode, in particular a semiconductor laser diode. The laser radiation generated by the semiconductor chip preferably has a comparatively large temporal coherence and a comparatively large spatial coherence. In this case, the laser radiation is coherent radiation. In this case, the radiation emitted by the two active regions is preferably monochromatic and coherent laser light. The radiation thus advantageously has a comparatively low bandwidth with a simultaneous comparatively high luminous flux.

By means of a portion of the radiation reflected at the inner surface and a portion of the radiation reflected at the anti-reflective coating, the semiconductor chip can be transformed from a superluminescent light-emitting diode to a laser diode.

For example, if the reflective inner surface is such that it only partially penetrates the propagation region, generated radiation can partially propagate between opposing reflective outer surfaces in the propagation region. In this case, the propagation region forms a resonator for the radiation. By superimposing the radiation propagating between the opposing reflective outer surfaces in the propagation region, laser light can be generated, for example, which is partially coupled out via the reflective inner surface and the anti-reflective coating.

For example, if the semiconductor chip has the plurality of active regions, the laser light of the pairs of the plurality of active regions is superimposed. This has the advantage of further increasing the coupling out efficiency of the semiconductor chip.

Furthermore, a reflectance of radiation can advantageously be predetermined by means of the anti-reflective coating. Thus, a portion of the radiation can be guided back into the propagation region, which can be formed as a resonator, by means of the anti-reflective coating on the first cladding layer.

According to one embodiment, properties of the electromagnetic radiation are predetermined by means of a thickness of the active regions and a width of the second contact layer. Preferably, the radiation has a fast axis and a slow axis in a far field. In the far field, the radiation propagates as a plane wave in space. The direction of oscillation of the radiation in which the plane wave has the greater propagation speed is called the "fast axis", the direction of oscillation, which is perpendicular to the fast axis and has a smaller propagation speed, is called the "slow axis".

The width of the active regions can be determined by the width of the second contact layer. The width of the active regions can also predetermine the slow axis. If the width is comparatively large, the slow axis usually has a comparatively small width. If the width is comparatively small, the slow axis usually has a comparatively small value.

According to one embodiment, the contact layer widens or tapers towards the electrically insulating region. If the contact layer widens or tapers towards the electrically insulating region, the electrical radiation can have a comparatively wide mode in a wider region. If the contact layer widens, the fast axis has a comparatively high value. If the contact layer tapers, the comparatively wide mode in a wider region can be filtered out by the tapering region and the fast axis has a comparatively small value. Advantageously, a high saturation can be achieved by means of the widening or tapering contact layer.

By means of the thickness of the active regions, the fast axis can be predetermined. If the thickness is comparatively large, the fast axis usually has a comparatively small width. If the thickness is comparatively small, the fast axis usually has a comparatively large width.

A method for producing a radiation-emitting semiconductor chip is further provided, by which a radiation-emitting semiconductor chip described herein can be produced. All features and embodiments disclosed in connection with the radiation-emitting semiconductor chip are therefore also applicable in connection with the method, and vice versa.

According to one embodiment of the method, a semiconductor layer sequence having an active zone suitable for generating electromagnetic radiation is provided.

According to one embodiment of the method, an outer recess is generated in the semiconductor layer sequence. The outer recess preferably completely penetrates the active zone. The outer recess is generated, for example, by material removal of the semiconductor layer sequence. The recess is generated, for example, by means of a chemical etching process.

According to one embodiment of the method, a reflective layer is applied to a side surface of the outer recess. The reflective layer preferably completely covers the side surface of the recess and forms the reflective outer surface.

According to one embodiment of the method, an electrically insulating layer is applied to a central region of the semiconductor layer sequence. In plan view, the central region is arranged in the centre of the semiconductor layer sequence. That is to say that in plan view, the central region preferably has maximum distances to side regions of the semiconductor layer sequence.

The electrically insulating layer forms the electrically insulating region. The electrically insulating layer and the reflective layer can be applied, for example, by means of chemical vapour deposition (CVD) or physical vapour deposition (PVD). The reflective layer and/or the electrically insulating layer can, for example, consist of a plurality of individual layers.

According to one embodiment of the method, the at least one side surface of the outer recess has an angle of at least 35° and at most 55° to a main extension plane of the semiconductor chip.

According to one embodiment of the method, an inner recess is formed in the semiconductor layer sequence in the central region.

According to one embodiment of the method, the electrically insulating layer is applied on a side surface of the inner recess. The electrically insulating layer can preferably completely cover the side surface of the inner recess.

According to one embodiment of the method, the side surface of the inner recess includes an angle of at least 35° and at most 55° with a main extension plane of the semiconductor chip.

According to one embodiment of the method, the semiconductor layer sequence is removed from a growth substrate. The semiconductor layer sequence is freely accessible at this region after removal of the growth substrate.

According to one embodiment of the method, a carrier is generated on the semiconductor layer sequence. For example, a prefabricated carrier can be applied in a form-fitting manner over a surface of the semiconductor layer sequence which has the recesses. Preferably, the carrier is formed before the growth substrate is removed.

Alternatively, a potting material is applied over a surface of the semiconductor layer sequence having the recesses. The potting material preferably completely fills the inner recess and the outer recess in the semiconductor layer sequence. Furthermore, the applied potting material can protrude beyond the recess so that a continuous layer of potting material is generated. Preferably, the potting material is in a flowable form when applied. In this case, the potting material is usually cured after application. The cured potting material preferably forms the carrier and is the mechanically stabilising component of the semiconductor chip.

According to one embodiment of the method, a plurality of radiation-emitting semiconductor chips can be produced by means of the method. Preferably, the plurality of semiconductor chips can be produced on a common wafer, which is separated, for example, after the semiconductor chips have been produced.

In the following, the radiation-emitting semiconductor chip and the method for producing the radiation-emitting semiconductor chip are explained in more detail by means of exemplary embodiments.

Elements that are identical, similar or similar acting are given the same reference signs in the figures. The figures and the proportions of the elements shown in the figures are not to be regarded as true to scale. Rather, individual elements can be shown exaggeratedly large for better representability and/or for better comprehensibility.

DETAILED DESCRIPTION

Figure 1:
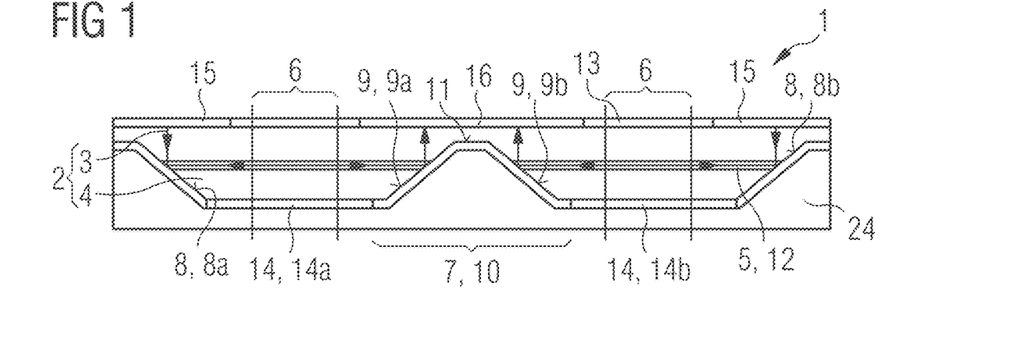
FIGS. 1 to 8 show schematic representations of a radiation-emitting semiconductor chip according to different exemplary embodiments.
Figure 2:
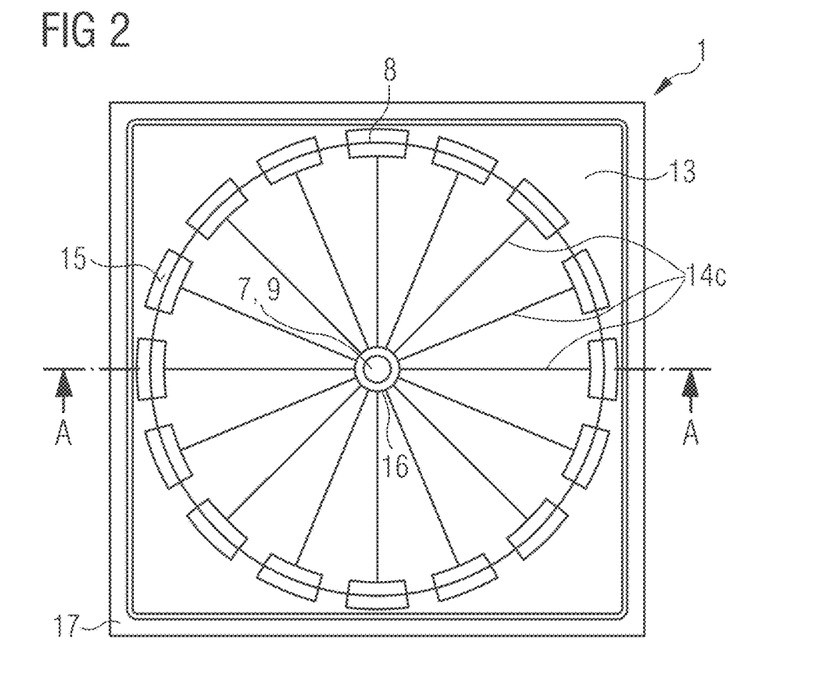

The schematic sectional view of FIG. 1 shows the exemplary embodiment of a semiconductor chip 1 described herein along a sectional line A-A shown in FIG. 2.

The semiconductor chip 1 according to the exemplary embodiment of FIGS. 1 and 2 comprises a semiconductor layer sequence 2 with at least two active regions 6 generating radiation during operation. FIG. 1 shows a sectional view along the sectional line A-A shown in FIG. 2. The semiconductor layer sequence 2 has a first cladding layer 3 and a second cladding layer 4, between which an active zone 5 is arranged which comprises the active regions 6. The active regions 6 are spaced apart from one another in the lateral direction and are arranged in a common plane. Furthermore, a propagation region 12 comprises the active zone 5. The radiation generated by the active regions 6 propagates in the propagation region 12, which extends parallel to the active zone 5.

A reflective outer surface 8 is arranged laterally of each active region 6. The reflective outer surface 8 has an angle of approximately 45° to a main extension plane of the semiconductor chip. Furthermore, the semiconductor chip has an electrically insulating region 7 arranged between the active regions 6. The electrically insulating region 7 has a reflective inner surface 9 arranged opposite the reflective outer surface 9. Furthermore, the electrically insulating region is formed as a protrusion 10, which is laterally delimited by the reflective inner surface 9. The reflective inner surface 9 has an angle of approximately 45° to a main extension plane of the semiconductor chip 1.

The reflective outer surface 8 and the reflective inner surface 9 completely penetrate the active zone 4 and the propagation region 12. Further, the semiconductor chip 1 has a support 24 which covers a surface of the semiconductor layer sequence facing the reflective inner surface 9 and the reflective outer surface 8 in a form fit manner.

In a cross-section perpendicular to the main extension plane of the semiconductor chip 1 corresponding to the section line A-A in FIG. 2, the reflective outer surface 8 comprises a first region 8a and a second region 8b facing one another. Each region of the reflective outer surface 8a, 8b is associated with an active region 6. Furthermore, in the cross-section perpendicular to the main extension plane of the semiconductor chip 1, the reflective inner surface 9 comprises a first region 9a and a second region 9b facing one another. Each region of the reflective inner surface 9a, 9b is associated with an active region 6.

An active region 6 is arranged between the first region of the reflective outer surface 8a and the first region of the reflective inner surface 9a. Furthermore, an active region 6 is arranged between the second region of the reflective outer surface 8b and the second region of the reflective inner surface 9b.

A first contact layer 13 is arranged in regions on a top surface of the semiconductor layer sequence 2. Furthermore, a second contact layer 14 is arranged on a bottom surface of the semiconductor layer sequence 2. In addition to the second contact layer 13, a reflective coating 15 is arranged on the top surface of the semiconductor layer sequence 2 in the region of the reflective outer surface 8. The reflective coating 15 is preferably a highly reflective coating. Furthermore, an anti-reflective coating 16 is arranged on the top surface of the semiconductor layer sequence 2 in the electrically insulating region 7.

According to the cross-section of the sectional line A-A in FIG. 2, the second contact layer 14 has a first contact region 14a and a second contact region 14b, which are each arranged spaced apart from one another in the lateral direction on a bottom surface of the semiconductor layer sequence 2. Furthermore, the contact regions 14a, 14b each have a width and a length.

According to the arrows shown in FIG. 1, directions of propagation of radiation are shown. The radiation generated in each of the active regions forms a beam with a beam profile which, in cross-section perpendicular to a main direction of extension of the beam, has a lateral and a vertical extension. Radiation propagating in the direction of the reflective outer surface 8 is directed towards the reflective inner surface 9 by means of the reflective coating 15 and further reflection at the reflective outer surface 8. Emitted radiation that propagates in the direction of the reflective inner surface 9 is superimposed on the radiation reflected at the reflective outer surface 8. The radiation of the active regions 6 superimposed in this way is superimposed in the region of the anti-reflective coating 16 and coupled out. The coupled out radiation is thus amplified and exhibits increased brightness and luminous flux.

The radiation-emitting semiconductor chip 2 according to the exemplary embodiment of FIGS. 1 and 2 is formed as a superluminescent light-emitting diode.

As shown in the top view of FIG. 2, the reflective outer surface 8 is formed continuously in the semiconductor chip according to the exemplary embodiment of FIGS. 1 and 2. The reflective outer surface 8 completely surrounds the electrically insulating region 7 formed by the reflective inner surface 9.

The first contact layer 13 covers the top surface of the semiconductor layer sequence 1 to a large extent. Furthermore, the semiconductor chip has a plurality of contact regions 14c. The first contact layer 13 and the second contact layer 14 with the plurality of contact regions 14c predetermine the lateral dimensions of each active region 6. Preferably, an active region 6 here has a larger area than an associated contact region of the second contact layer 14.

The active regions 6 predetermined by the plurality of contact regions 14c are arranged in pairs opposite one another and in a circular shape. The contact regions of the plurality of contact regions 14c respectively predetermine a length and width of the active regions 6. The pairwise opposite active regions 6 have a common axis (see, for example, section A-A) extending along the lengths. An angle is arranged between the axes of pairwise opposite active regions 6. In this case, the axes intersect in the electrically insulating region 7. Furthermore, the angles between the axes are equidistant.

The semiconductor chip 1 is further surrounded by a frame 20. The frame 20 separates a functional region from the outside. The frame 20 is, for example, an elevation or a depression.

Figure 3:
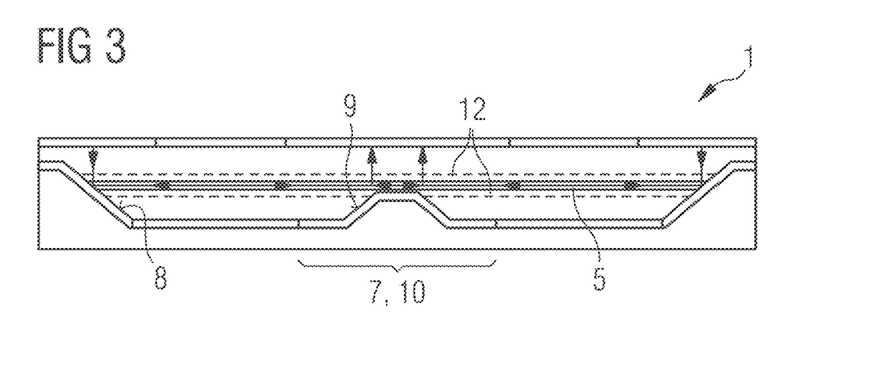
Figure 4:
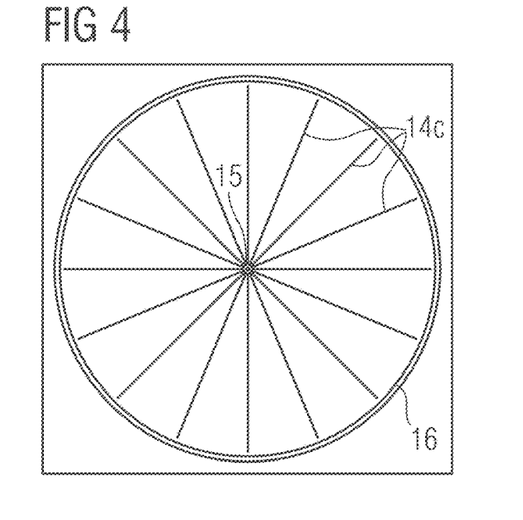
Figure 5:
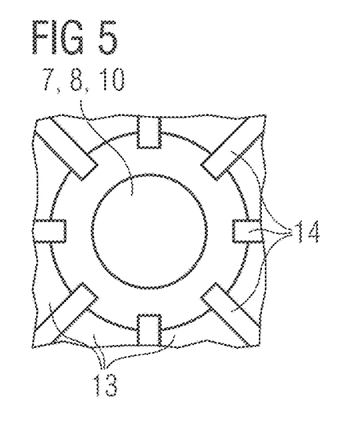
Figure 6:
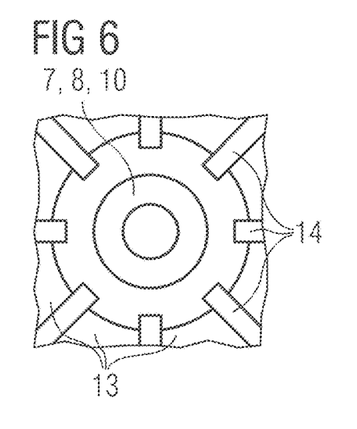
Figure 7:
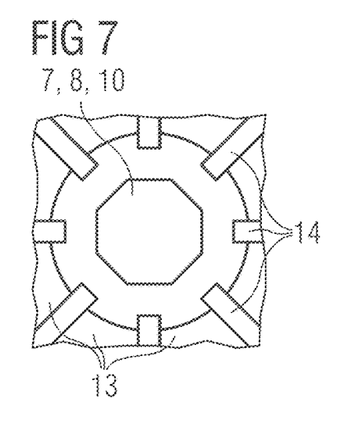
Figure 8:
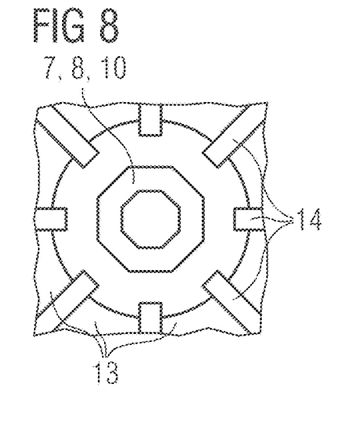

In contrast to the exemplary embodiment according to FIGS. 1 and 2, the reflective inner surface 9 of the semiconductor chip 1 according to the exemplary embodiment of FIG. 3 partially penetrates the propagation region 12.

In this exemplary embodiment, the propagation region 12 is arranged around the active zone 5. The propagation region 12 protrudes beyond the active zone 5 in vertical direction. That is to say that the beam profile of the beam protrudes beyond the active zone 5 in vertical direction.

The propagation region 12 is arranged between the first cladding layer 3 and the second cladding layer 4. For example, the propagation region 12 can comprise materials different from the materials of the first cladding layer 3 and the second cladding layer 4. In this case, the cladding layers 3, 4 have a lower refractive index for the radiation than the propagation region 12.

The generated radiation thus partially propagates between opposing reflective outer surfaces 8 in the propagation region 12. In the present exemplary embodiment, the propagation region 12 forms a resonator for the radiation. By means of the anti-reflective coating, for example, a degree of reflection of the radiation can be predetermined. Thus, a portion of the radiation can be guided back into the propagation region 12, which can be configured as a resonator, by means of the anti-reflective coating 16.

If a comparatively small proportion of the radiation is reflected by the reflective inner surface 9 and a comparatively large proportion of the radiation is reflected back by the anti-reflective coating 16, it is possible to generate and couple out laser light.

In contrast to the exemplary embodiments in connection with FIGS. 1 and 2 or 3, the anti-reflective coating 16 is arranged above the reflective outer surface 8. Furthermore, the semiconductor chip 2 does not have an insulating region 7. In this exemplary embodiment, the at least two active regions of the semiconductor chip are directly adjacent to one another.

According to FIGS. 5, 6, 7 and 8, schematic representations are shown in plan view of a semiconductor chip 1 according to a respective exemplary embodiment, in which the reflective inner surface 8 has the shape of a circle (FIG. 5), a round ring (FIG. 6), a polygon (FIG. 7) or a polygonal ring (FIG. 8) in plan view.

Figure 9:
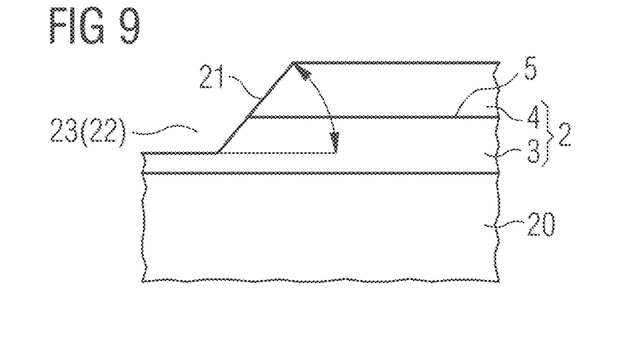
FIGS. 9 to 12 show schematic sectional views of process stages of a method for producing a radiation-emitting semiconductor chip according to an exemplary embodiment.

In the method according to the exemplary embodiment of FIGS. 9, 10, 11 and 12, a semiconductor layer sequence 2 is first provided on a growth substrate 20 (FIG. 9). An inner recess 23 and an outer recess 23 (not shown here) are formed in the semiconductor layer sequence 2. A side surface of the inner recess 23 has an angle 21 of approximately 45° to a main extension plane of the semiconductor chip 1.

Figure 10:
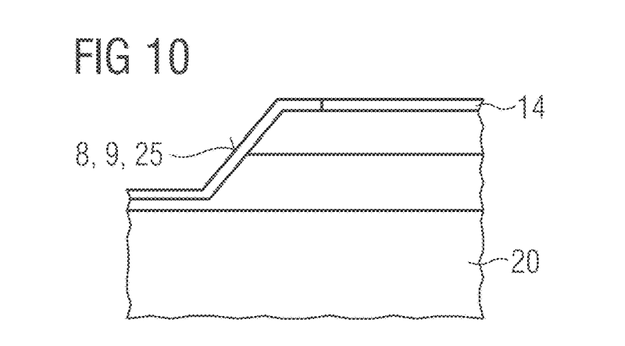

In the method step according to FIG. 10, an electrically insulating layer is applied to a side surface of the inner recess 23 forming the electrically insulating region 7. Furthermore, the second contact layer 14 is applied on the semiconductor layer sequence 2.

Figure 11:
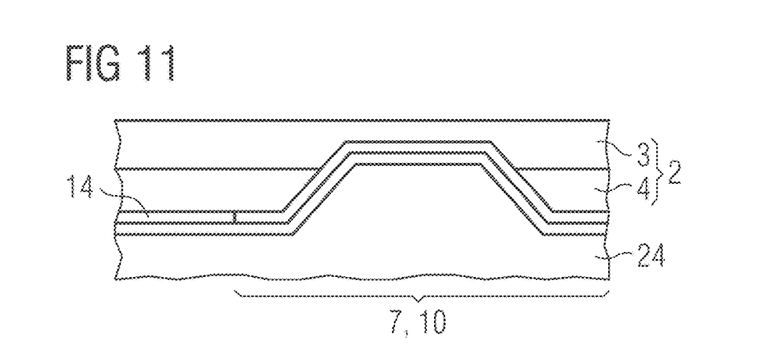

Further, as shown in FIG. 11, a prefabricated carrier 24 is applied over a surface of the semiconductor layer sequence 2 having the recesses 23, 22 in a form fit manner. The prefabricated carrier 24 comprises, for example, silicon. Furthermore, the carrier 24 can be formed from a potting. For example, the potting is a metal. Subsequently, the semiconductor layer sequence 2 is removed from the growth substrate 20.

Figure 12:
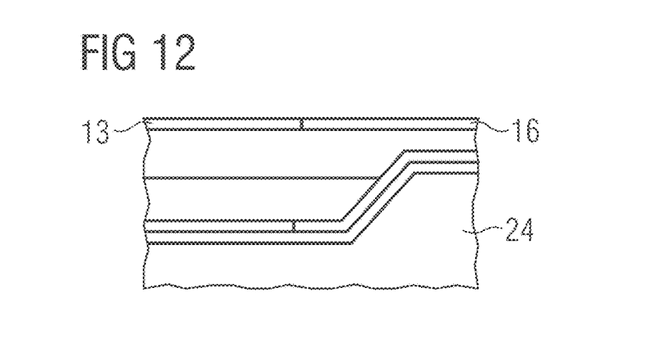

In a further method step according to FIG. 12, the first contact structure 13, the anti-reflective coating 16 and the reflective coating 15 (not shown here) are applied to the semiconductor layer sequence 2 exposed from the growth substrate 20.

Figure 13:
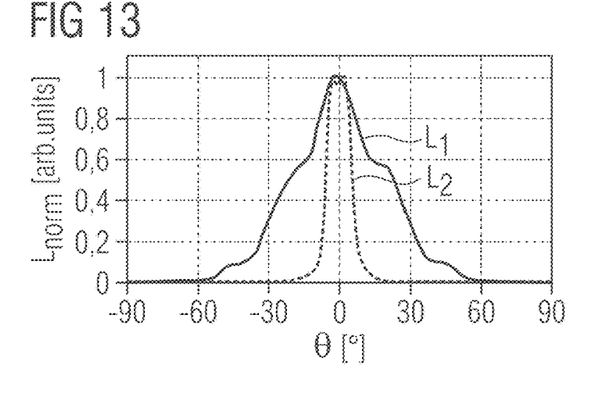
FIGS. 13 to 15 show exemplary measurements of the far field of electromagnetic radiation.

In FIG. 13, far-field measurements of electromagnetic radiation from a conventional radiation-emitting semiconductor chip having a single active region are plotted on a graph in which a normalised radiant power $L_{norm}$ of the radiation is plotted in arbitrary units versus polar coordinates θ in degrees [°]. The measured radiant power of the radiation in the far field is here produced by a single active region.

Figure 14:
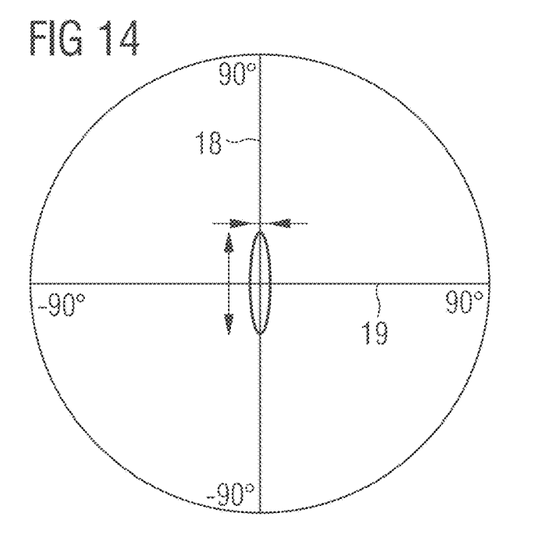

Along a fast axis 18, the radiation has a radiant power L1 that has a full width half maximum (FWHM) of, for example, 40°. A slow axis 19 is arranged perpendicular to the fast axis 18, as shown in a polar coordinate diagram in FIG. 14. Radiation along a slow axis 19 perpendicular to the fast axis 18 has a radiant power $L_2$ with a half-value width of, for example, 8° (see FIG. 13).

Figure 15:
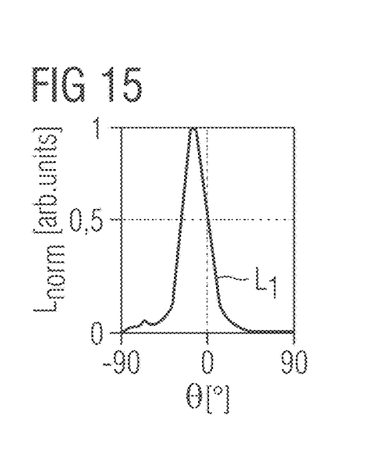

By means of the width of the active region, the fast axis 18 can be predetermined. According to FIG. 15, the width of the active region is wide compared to an active region as specified in FIG. 13, so that the full width half maximum of the radiant power of the fast axis L1 is reduced to, for example, 32°.

Figure 16:
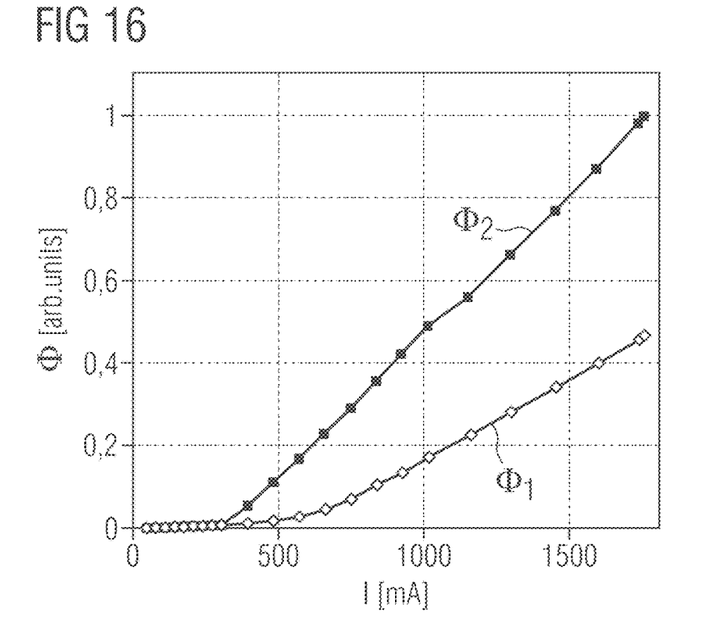
FIGS. 16 to 18 show exemplary measurements of the luminous flux of electromagnetic radiation.
Figure 17:
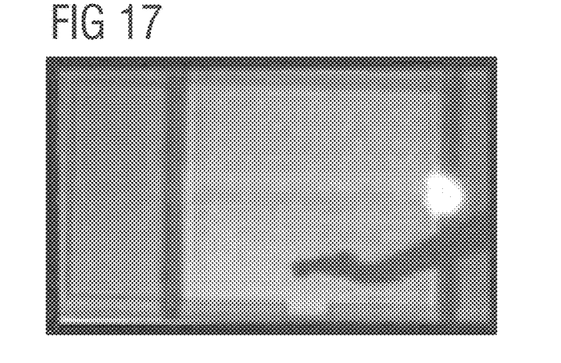
Figure 18:
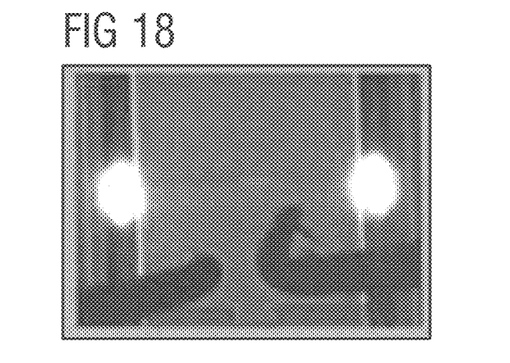

Measurements of the luminous flux Φ of radiation of a semiconductor chip according to an exemplary embodiment are shown in FIG. 16. In the diagram, the luminous flux Φ in arbitrary units is plotted against a current I applied to a semiconductor chip in milliamperes [mA]. A first curve $\Phi_1$ corresponds to a conventional semiconductor chip in which the semiconductor chip has only a single active region. A second curve $\Phi_2$ corresponds to a semiconductor chip 1 according to the exemplary embodiment of FIG. 4, in which the semiconductor chip 1 has two active regions 6. The conventional semiconductor chip exemplarily shown in FIG. 17 has only one active region and is associated with the first curve $\Phi_1$. The exemplary semiconductor chip 1 shown in FIG. 18 has two opposing active regions 6 and is assigned to the second curve $\Phi_2$.

According to FIGS. 19, 20, 21, 22, 23 and 24, simulations of the far field of radiation of a semiconductor chip are shown according to an exemplary embodiment each. The far field of the radiation is shown in a polar coordinate diagram. The embodiments of FIGS. 19 and 20 correspond to a semiconductor chip 1 with two opposing active regions 6. The embodiments of FIGS. 21 and 22 correspond to a semiconductor chip 1 with eight opposing active regions 6. The embodiments of FIGS. 23 and 24 correspond to a semiconductor chip 1 with sixteen opposing active regions 6.

Figure 19:
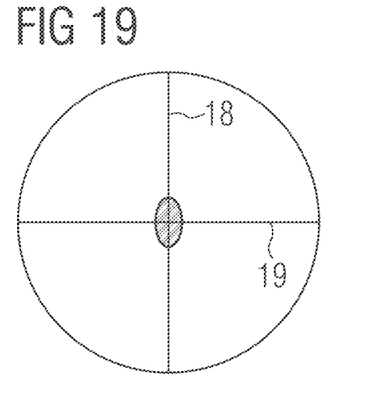
FIGS. 19 to 24 show simulations of the far field of electromagnetic radiation according to an exemplary embodiment each.
Figure 20:
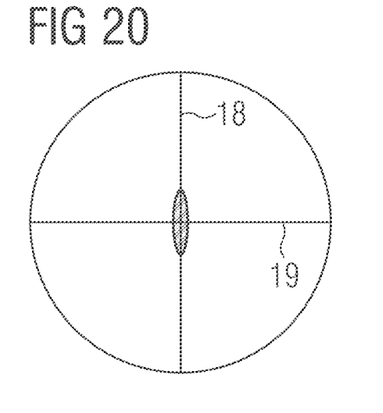
Figure 21:
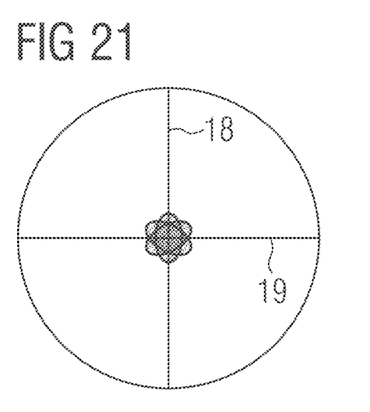
Figure 22:
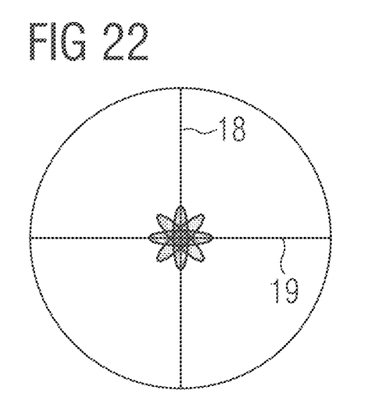
Figure 23:
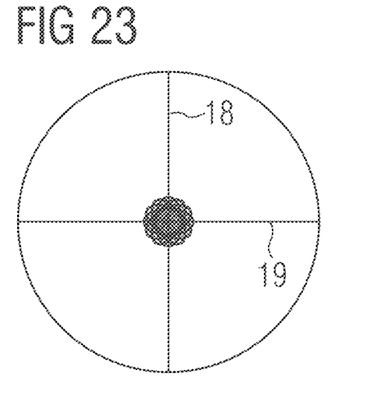
Figure 24:
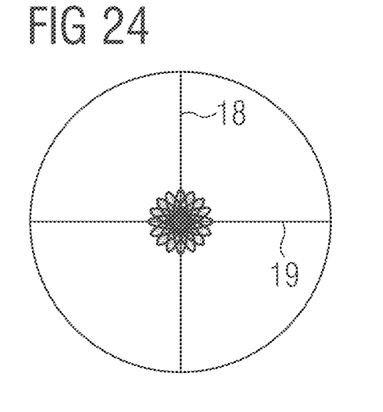

According to FIGS. 19, 21 and 23, the full width half maximum of the radiated power of the radiation is 30° on the fast axis 18 and 16° on the slow axis 19. According to FIGS. 20, 22 and 24, the full width half maximum on the fast axis 18 is 40° and on the slow axis 19 is 8°.

Figure 25:
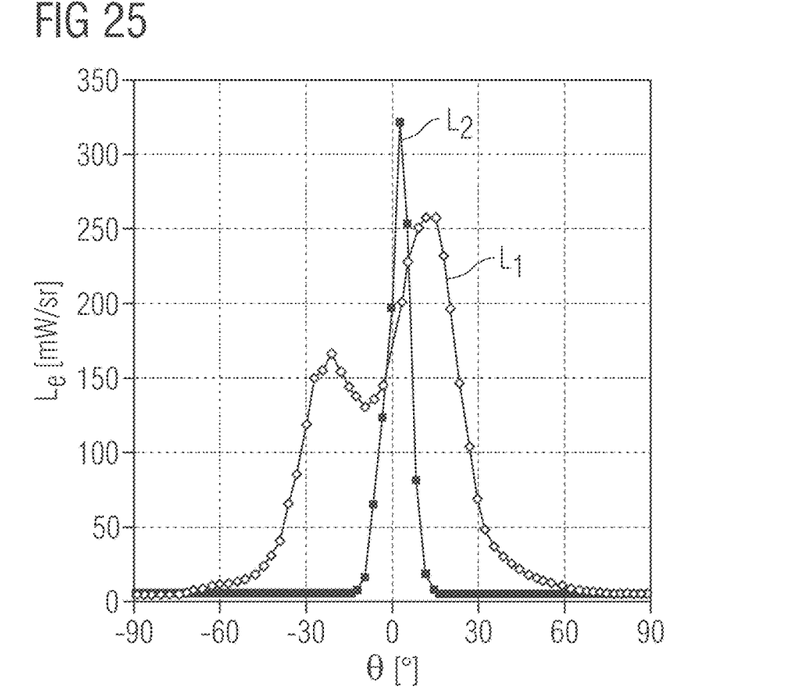
FIGS. 25 and 26 show measurements of the far field of electromagnetic radiation of a radiation-emitting semiconductor chip according to an exemplary embodiment.

According to FIG. 25, measurements of the far field of radiation are plotted on a graph in which a radiant power $L_e$ of the radiation is plotted with units [mW/sr] versus polar coordinates θ in degrees [°]. Here, the radiation is generated by a semiconductor chip 1 having two opposing active regions 6. Along the fast axis 18, the radiation has a radiant power $L_1$. The radiation has a radiant power $L_2$ along the slow axis 19.

In this exemplary embodiment, the reflective outer surface 8 and/or the reflective inner surface 7 has an angle to a main extension plane of the semiconductor chip 1 different from 45° but between at least 35° and at most 55°. As a result, the spectrum of the radiated power has two separate peaks.

Figure 26:
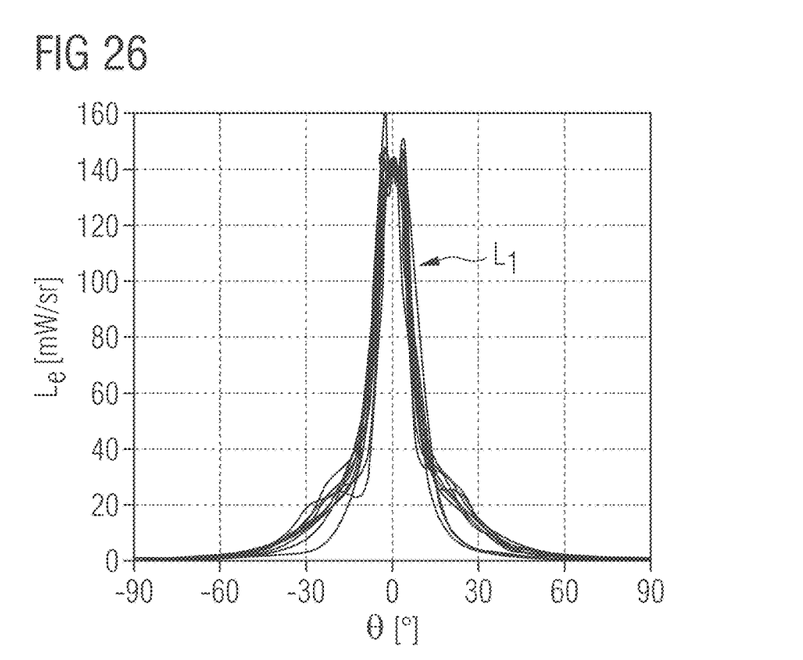

According to FIG. 26, radiation powers $L_1$ of the far field of the radiation along the fast axis 18 are shown. In this embodiment, the semiconductor chip 1 has active regions 6 arranged in pairs opposite one another. Analogous to FIG. 25, the reflecting outer surface 8 and/or the reflecting inner surface 7 has an angle to a main extension plane of the semiconductor chip 1 which is different from 45°. By means of the plurality of active regions arranged in pairs opposite to one another and in a circular shape, a common spectrum of radiant powers of the active regions 6 has only one main peak, unlike in FIG. 25.

According to FIGS. 27, 28, 29, 30 and 31, the reflective outer surfaces 8 are not formed continuously. The first region of the reflective outer surface 8a and the second region of the reflective outer surface (8b) (not shown here) are straight in these exemplary embodiments and are spaced apart in the lateral direction.

Figure 27:
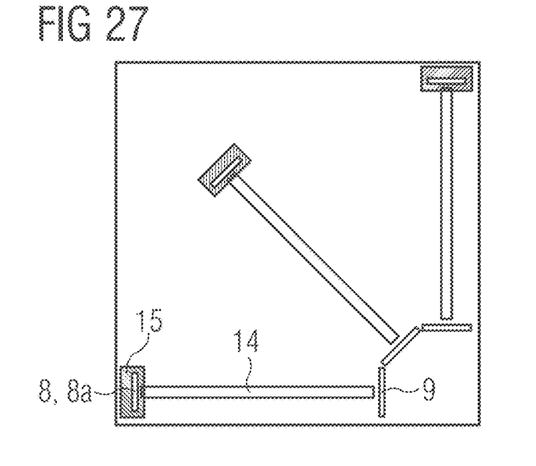
FIGS. 27 to 31 show schematic representations of a section of a radiation-emitting semiconductor chip according to an exemplary embodiment each.
Figure 28:
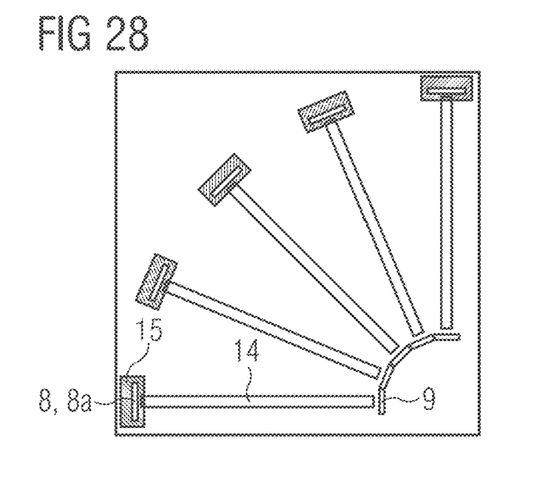
Figure 29:
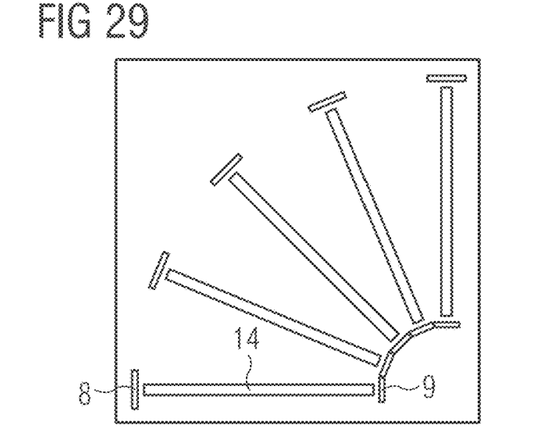
Figure 30:
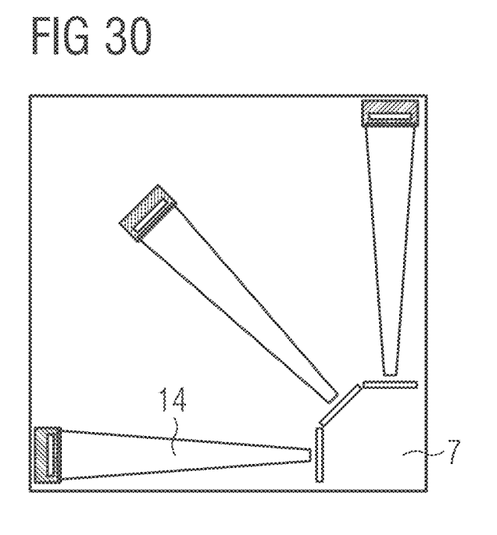
Figure 31:
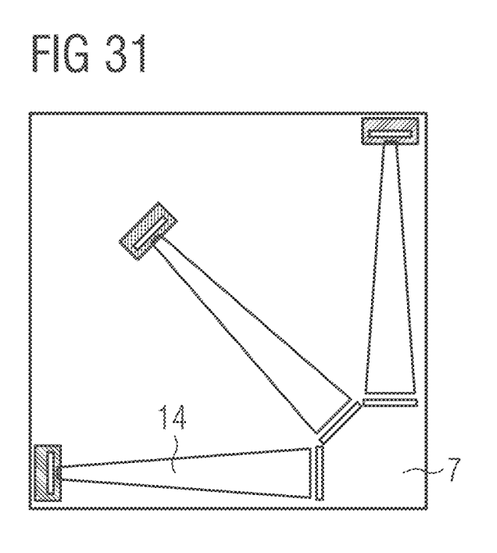

In contrast to the exemplary embodiment in connection with FIGS. 27, 28 and 29, the contact regions 14 of the second contact layer 14 of FIGS. 30 and 31 have a shape tapering (FIG. 28) or widening (FIG. 29) towards the electrically insulating region 7.

The invention is not limited to the exemplary embodiments by the description based thereon. Rather, the invention encompasses any new feature as well as any combination of features, which in particular includes any combination of features in the claims, even if this feature or combination itself is not explicitly indicated in the claims or exemplary embodiments.

The invention claimed is:

1. A radiation emitting semiconductor chip comprising:
   a semiconductor layer sequence having at least two active regions, which generate electromagnetic radiation during operation,
   at least one reflective outer surface arranged laterally of each active region, and
   an electrically insulating region arranged between the active regions, wherein
   the electrically insulating region has a reflective inner surface arranged opposite the reflective outer surface,
   the reflecting inner surface includes an angle of at least 35° and at most 55° with a main extension plane of the semiconductor chip
   the reflecting outer surface includes an angle of at least 35° and at most 55° with a main extension plane of the semiconductor chip and
   a reflective coating is arranged on the semiconductor layer sequence in a region of the reflective outer surface and an anti-reflective coating is arranged on the semiconductor layer sequence in the electrically insulating region, or
   an anti-reflective coating is arranged on the semiconductor layer sequence in the region of the reflective outer surface and a reflective coating is arranged on the semiconductor layer sequence in the electrically insulating region.

2. The radiation-emitting semiconductor chip according to claim 1, in which the reflective outer surface is formed continuously and completely encloses the electrically insulating region.

3. The radiation-emitting semiconductor chip according to claim 1,
   in which the reflective inner surface has the shape of a circle, a round ring, a polygon or a polygonal ring in plan view.

4. The radiation-emitting semiconductor chip according to claim 1,
   in which the electrically insulating region is formed as a protrusion laterally delimited by the reflective inner surface.

5. The radiation-emitting semiconductor chip according to claim 1,
   in which the semiconductor layer sequence has an active zone comprising the active regions.

6. The radiation-emitting semiconductor chip according to claim 5,
   in which the reflective inner surface completely penetrates the active zone.

7. The radiation-emitting semiconductor chip according to claim 5, in which
   the active zone comprises a propagation region,
   the propagation region is arranged around the active zone, and
   the reflective inner surface partially penetrates the propagation region.

8. The radiation-emitting semiconductor chip according to claim 5,
   in which the reflective outer surface completely penetrates the active zone.

9. The radiation-emitting semiconductor chip according to claim 1, in which
   a first contact layer is arranged on a top surface of the semiconductor layer sequence,
   a second contact layer is arranged on a bottom surface of the semiconductor layer sequence, and
   the first contact layer and the second contact layer predetermine the lateral dimensions of each active region.

10. The radiation-emitting semiconductor chip according to claim 1,
    in which the semiconductor layer sequence comprises a plurality of active regions arranged in pairs opposite one another and circularly.

11. The radiation-emitting semiconductor chip according to claim 1,
    in which the radiation-emitting semiconductor chip is a superluminescent light-emitting diode.

12. The radiation-emitting semiconductor chip according to claim 1,
    in which the radiation-emitting semiconductor chip generates laser radiation.

13. The radiation-emitting semiconductor chip according to claim 9,
    in which characteristics of the electromagnetic radiation are predetermined by means of a thickness of the active regions and a width of the second contact layer.

14. A method for producing a radiation-emitting semiconductor chip comprising:
    providing a semiconductor layer sequence having an active zone configured to generate electromagnetic radiation,
    generating an outer recess in the semiconductor layer sequence,
    applying a reflective layer on at least one side surface of the outer recess,
    generating an inner recess in the semiconductor layer sequence in a central region, and
    applying an electrically insulating layer to a side surface of the inner recess, wherein
    the at least one side surface of the outer recess includes an angle of at least 35° and at most 55° with a main extension plane of the semiconductor chip,
    the side surface of the inner recess includes an angle of at least 35° and at most 55° with a main extension plane of the semiconductor chip and
    a reflective coating is arranged on the semiconductor layer sequence in a region of the reflective outer surface and an anti-reflective coating is arranged on the semiconductor layer sequence in the electrically insulating region, or
    an anti-reflective coating is arranged on the semiconductor layer sequence in the region of the reflective outer surface and a reflective coating is arranged on the semiconductor layer sequence in the electrically insulating region.

15. The method according to claim 14, wherein
    the semiconductor layer sequence is removed from a growth substrate, and
    a carrier is generated on the semiconductor layer sequence.

16. The method according to claim 14, wherein a plurality of radiation-emitting semiconductor chips are produced by means of the method.

* * * * *